(12) United States Patent
Alashmouny et al.

(10) Patent No.: US 11,165,416 B2
(45) Date of Patent: Nov. 2, 2021

(54) DUTY CYCLE AND SKEW MEASUREMENT AND CORRECTION FOR DIFFERENTIAL AND SINGLE-ENDED CLOCK SIGNALS

(71) Applicant: Apple Inc., Cupertino, CA (US)

(72) Inventors: Khaled M. Alashmouny, Santa Clara, CA (US); Dennis M. Fischette, Jr., Mountain View, CA (US); Charles L. Wang, Los Altos, CA (US); Samed Maltabas, Santa Clara, CA (US); Yikun Chang, Fremont, CA (US)

(73) Assignee: Apple Inc., Cupertino, CA (US)

( * ) Notice: Subject to any disclaimer, the term of this patent is extended or adjusted under 35 U.S.C. 154(b) by 137 days.

(21) Appl. No.: 16/701,844

(22) Filed: Dec. 3, 2019

(65) Prior Publication Data

US 2021/0167766 A1   Jun. 3, 2021

(51) Int. Cl.
*H03K 5/156* (2006.01)
*G06F 1/10* (2006.01)

(52) U.S. Cl.
CPC ............. *H03K 5/1565* (2013.01); *G06F 1/10* (2013.01)

(58) Field of Classification Search
None
See application file for complete search history.

(56) References Cited

U.S. PATENT DOCUMENTS

| | | | |
|---|---|---|---|
| 3,737,778 A | 6/1973 | Van Gerwen | |
| 6,845,490 B2 | 1/2005 | Natsume | |
| 7,325,175 B2 | 1/2008 | Momtaz | |
| 7,339,989 B1 | 3/2008 | McAdam | |
| 7,433,397 B2 | 10/2008 | Garlepp et al. | |
| 8,243,782 B2 | 8/2012 | Mobin | |
| 8,509,292 B2 | 8/2013 | Lee et al. | |
| 8,531,225 B1 | 9/2013 | Hussain | |
| 8,553,805 B2 | 10/2013 | Monsen et al. | |
| 8,611,408 B2 | 12/2013 | Xia et al. | |

(Continued)

OTHER PUBLICATIONS

Dadnam, Fariborz, "Post-Silicon Tuning with the Aim of Clock Skew Reduction", EE201C; UCLA WIN12; Professor Lie He; Final Project; http://eda.ee.ucla.edu/EE201C/uploads/Winter2012/203826785FariborzDadnam/DadnamFariborzFinalReport.pdf. [Retrieved Aug. 5, 2019].

(Continued)

*Primary Examiner* — Cassandra F Cox
(74) *Attorney, Agent, or Firm* — Rory D. Rankin; Kowert, Hood, Munyon, Rankin & Goetzel, P.C (57) ABSTRACT

A system and method for efficient on-chip monitoring of clock signals post-silicon. An electronic circuit includes a post-silicon and on-die signal monitor and a first signal generator that sends a first signal with a first signal period to the signal monitor. The signal monitor selects a first sampling signal with a first sampling period such that a ratio of the first sampling period to the first signal period is greater than one and is a non-integer. The signal monitor selects a reference voltage level for indicating when the first signal is asserted. When the first sampling period has elapsed, the signal monitor samples the first signal to generate a voltage level, and upon completing sampling, determines a duty cycle of the generated voltage levels, which indicates a duty cycle of the first signal. Using a similar approach, the signal monitor is also capable of determining skew between two signals.

20 Claims, 8 Drawing Sheets

(56) References Cited

U.S. PATENT DOCUMENTS

| | | |
|---|---|---|
| 8,856,578 B2 | 10/2014 | Itou |
| 9,053,257 B2 | 6/2015 | Schreiber |
| 9,407,247 B2 | 8/2016 | Drake et al. |
| 9,536,038 B1 | 1/2017 | Quinton |
| 9,664,737 B2 | 5/2017 | Tee et al. |
| 9,760,672 B1 | 9/2017 | Taneja |
| 9,906,231 B2 | 2/2018 | Kang |
| 10,069,496 B1 | 9/2018 | Behl |
| 10,574,487 B1 | 2/2020 | Hormati |
| 10,886,903 B1 | 1/2021 | Krishnamurthy |
| 10,972,107 B2 | 4/2021 | Han et al. |
| 2005/0186933 A1 | 8/2005 | Trans |
| 2009/0134912 A1 | 5/2009 | Habel |
| 2012/0044003 A1 | 2/2012 | Itou |
| 2013/0117582 A1 | 5/2013 | Satyamoorthy |
| 2013/0311792 A1 | 11/2013 | Ponnathota |
| 2013/0311799 A1 | 11/2013 | Fitzpatrick |
| 2014/0205028 A1 | 7/2014 | Bogdan |
| 2016/0065195 A1 | 3/2016 | Farazian |
| 2016/0380748 A1 | 12/2016 | Simpson |
| 2017/0046469 A1 | 2/2017 | Rao |
| 2017/0163452 A1 | 6/2017 | Breiling et al. |
| 2019/0020508 A1 | 1/2019 | Noda |
| 2020/0005729 A1 | 1/2020 | Mozak |
| 2020/0028514 A1 | 1/2020 | Hanke |
| 2020/0081062 A1 | 3/2020 | Goh |
| 2020/0091608 A1 | 3/2020 | Alpman |
| 2020/0118612 A1 | 4/2020 | Finn |
| 2020/0143901 A1 | 5/2020 | Chhabra |
| 2021/0080503 A1* | 3/2021 | Li .................. G01R 31/31711 |

OTHER PUBLICATIONS

Hu et al., "Unified Adaptivity Optimization of Clock and Logic Signals", ICCAD '07: Proceedings of the 2007 IEEE/ACM international conference on Computer-aided design, Nov. 2007, pp. 125-130.

Nagaraj, Kelageri, "Post Silicon Clock Tuning System to Mitigate the Impact of Process Variation on Performance", (2010) Masters Theses 1911, Feb. 2014, 76 pages, https://scholarworks.umass.edu/cgi/viewcontent.cgi?article=1455&context=theses.

Tadesse et al., "AutoRex: An Automated Post-Silicon Clock Tuning Tool", 2009 International Test Conference, Nov. 2009, 10 pages.

* cited by examiner

DUTY CYCLE AND SKEW MEASUREMENT AND CORRECTION FOR DIFFERENTIAL AND SINGLE-ENDED CLOCK SIGNALS

BACKGROUND

Technical Field

Embodiments described herein relate to the field of electronic circuits, and more particularly, to efficient on-chip monitoring of clock signals post-silicon.

Description of the Related Art

Geometric dimensions of devices and metal routes on each generation of semiconductor processor cores are decreasing. Therefore, more functionality is provided within a given area of on-die area. As a result, mobile devices, such as laptop computers, tablet computers, smart phones, video cameras, and the like, have increasing popularity. Performance of electronic circuits is dependent on the operating frequencies of clock signals. Multiple factors degrade the clock cycle phase(s) and period, which affects the clock operational frequency. Examples of these factors are clock skew and clock jitter. When the clock signal is degraded, the performance of the electronic circuit is reduced due to the effects on the setup time and clock-to-output propagation delay of (at least) latches and flip-flops.

Designers reduce clock skew and clock jitter by designing clock distribution networks that account for metal trace parasitic effects such as resistance, capacitance and inductance. These clock distribution networks provide known setup and hold time requirements for sequential elements such as latches and flip-flops. However, designers analyze the clock distribution network using pre-silicon circuit simulations that characterize both transistors and routed metal traces of electronic circuits. Although some analysis occurs post-silicon after the actual die is fabricated and returned for testing, this analysis also estimates actual post-silicon conditions. When these die are shipped in manufactured products, variations between the pre-manufacture models and the real behavior and system variations in the manufactured products cause changes in clock skew and clock jitter. Examples of the system variations are the actual in-use operating temperature and operating voltage in the post-silicon die.

In view of the above, efficient methods and mechanisms for efficient on-chip monitoring of clock signals post-silicon are desired.

SUMMARY

Systems and methods for efficient on-chip monitoring of clock signals post-silicon are contemplated. In various embodiments, an electronic circuit includes an on-die signal monitor, a first signal generator and a second signal generator. The first signal generator generates a first signal with a first signal period which is received by the signal monitor. In various embodiments, the first signal is a clock signal and the first signal period is a clock cycle period. Similarly, the second signal generator generates a second signal with a second signal period and sends it to the signal monitor. In various embodiments, the second signal is a clock signal and the second signal period is a clock cycle period. In various embodiments, an on-die control unit sends a mode of operation to the signal monitor. Examples of the modes of operation are a mode of operation, such as a duty cycle mode, indicating a duty cycle is to be determined of a selected signal and a mode of operation, such as a skew mode, indicating a skew is to be determined between two selected signals. In various embodiments, the signal monitor uses pseudo-random sampling when determining duty cycle or skew.

When the selected mode is the duty cycle mode, in an embodiment, the control unit also selects one of the first signal and the second signal for determining the duty cycle. The signal monitor also generates a first pseudo-random sampling signal to use when determining the duty cycle of the selected signal. In an embodiment, the first pseudo-random sampling signal includes multiple pseudo-random sampling periods, or multiple periods of time having varying lengths. When the signal monitor determines that one of the multiple pseudo-random sampling periods has elapsed, the signal monitor samples the selected signal to generate a voltage level. The signal monitor compares the generated voltage level to a reference voltage level to generate a characterized signal. In one embodiment, the reference voltage level is a Boolean logic high level.

After generating the characterized signal, the signal monitor determines a duty cycle of the characterized signal. In some embodiments, when the signal monitor determines one of the multiple pseudo-random sampling periods has elapsed, the signal monitor increments a first count of samples indicating a number of measured samples. In addition, the signal monitor increments a second count of samples when the signal monitor determines that the generated voltage level equals the reference voltage level. In an embodiment, when the signal monitor determines a given number of samples has been reached, the signal monitor determines the duty cycle by determining a ratio of the second count to the first count. In some embodiments, the signal monitor conveys the duty cycle to one or more signal generators for possibly adjusting the selected signal.

When the selected mode is the skew mode, in an embodiment, the signal monitor receives the first signal and the second signal. In addition, the signal monitor generates a second pseudo-random sampling signal to use when determining the skew between the first signal and the second signal. The second pseudo-random sampling signal includes multiple pseudo-random sampling periods, or multiple periods of time having varying lengths. Responsive to determining, by the signal monitor, a period of time of the multiple periods of time having varying lengths has elapsed, the signal monitor samples the first signal to generate a first voltage level and samples the second signal to generate a second voltage level. The signal monitor compares the first voltage level and the second voltage level to generate a characterized signal. After sampling, the on-die signal monitor determines a duty cycle of the characterized signal, which also indicates the skew between the first signal and the second signal.

In some embodiments, when the signal monitor determines one of the multiple pseudo-random sampling periods has elapsed, the signal monitor increments a third count of samples. In addition, the signal monitor increments a fourth count of samples based on determining that the first voltage level does not equal the second voltage level. In an embodiment, when the signal monitor determines a limit of a number of samples has been reached, the signal monitor determines the skew by determining a ratio of the fourth count to the third count. In some embodiments, the signal monitor conveys the skew to one or more of the first signal generator and the second signal generator for possible adjustments.

These and other embodiments will be further appreciated upon reference to the following description and drawings.

BRIEF DESCRIPTION OF THE DRAWINGS

The above and further advantages of the methods and mechanisms may be better understood by referring to the following description in conjunction with the accompanying drawings, in which.

While the embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) for that unit/circuit/component.

DETAILED DESCRIPTION OF EMBODIMENTS

In the following description, numerous specific details are set forth to provide a thorough understanding of the embodiments described in this disclosure. However, one having ordinary skill in the art should recognize that the embodiments might be practiced without these specific details. In some instances, well-known circuits, structures, and techniques have not been shown in detail for ease of illustration and to avoid obscuring the description of the embodiments.

Figure 1:
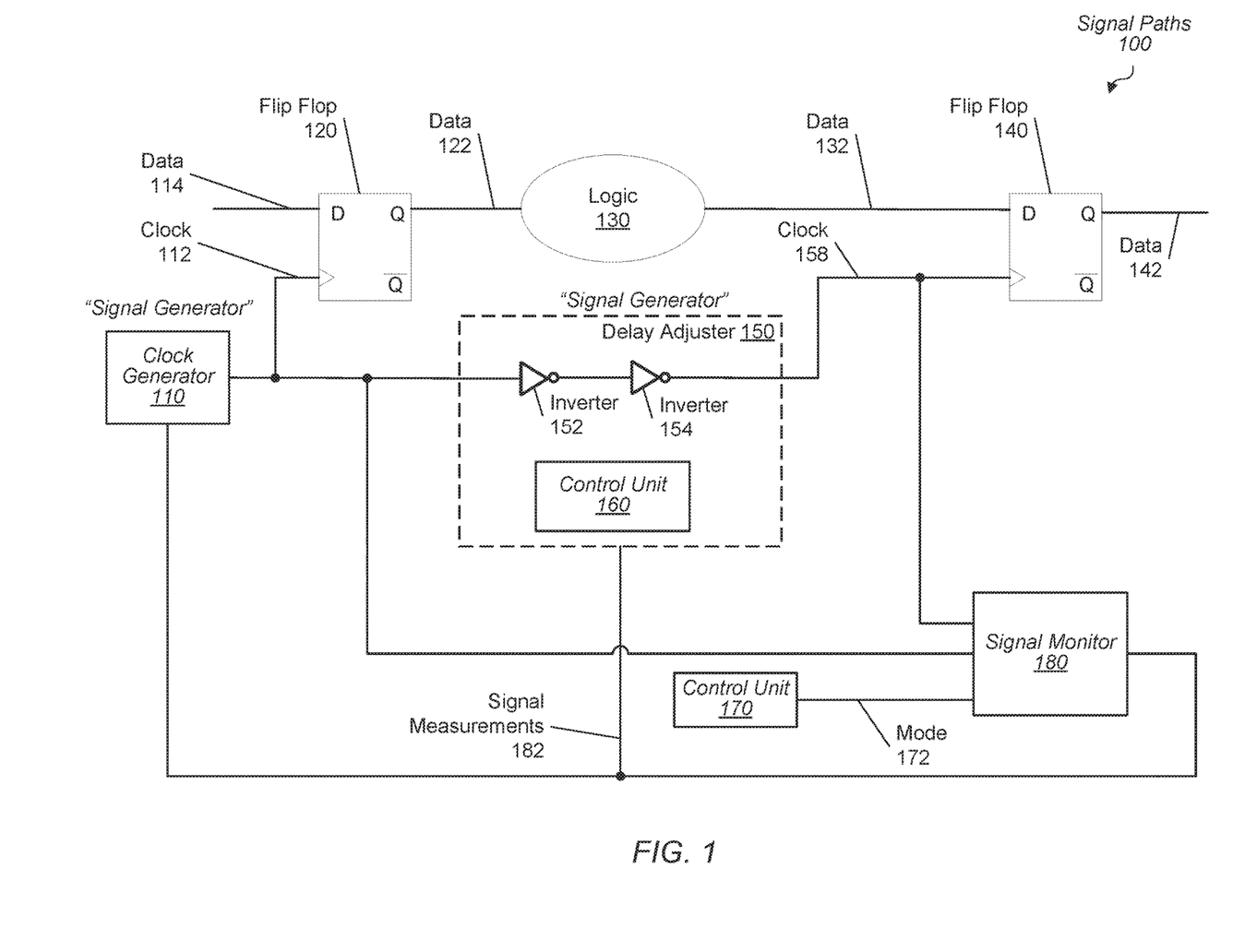
FIG. 1 is a block diagram of one embodiment of signal paths.

Referring to FIG. 1, a generalized block diagram of one embodiment of signal paths 100 is shown. In the illustrated embodiment, the clock generator 110 generates the clock signal 112, which the flip-flop 120 receives. The flip-flop 120 also receives data 114 as input data and provides data 122 as output data. Logic 130 represents any variety of combinational logic, dynamic logic and so on, which processes data 122. Logic 130 generates data 132, which flip-flop 140 receives. Flip-flop 140 also receives clock signal 158, which is a delayed version of clock signal 112. In an embodiment, the delay adjuster 150 receives the clock signal 112 and generates the clock signal 158. Flip-flop 140 conveys data 142 to other logic and/or staging sequential elements. In some embodiments, the on-die signal monitor 180 receives the clock signals 112 and 158 as well as control information, such as mode 172, from the control unit 170. The signal monitor 180 analyzes one or more of the clock signals 112 and 158, and generates the signal measurements 182. One or more of the clock generator 110 and the delay adjuster 150 receive the signal measurements 182, and possibly adjust the generated clock signals 112 and 158.

In various embodiments, signal paths 100 may be included in any of a variety of devices such as a general-purpose processor, an application specific integrated circuit (ASIC), a system on chip (SoC), a graphics processing unit (GPU), a synchronous memory, or otherwise. In various embodiments, the device includes a clock distribution network and circuitry. Generally speaking, the circuitry receives one or more input clock signals through an interface from the clock distribution network, and includes a clock generator for generating one or more additional clock signals based upon the received one or more input clocks. Each of the generated clock signals has a clock cycle period (or period). In an embodiment, the clock generator 110 includes one of a variety of types of one or more of a phase locked loop (PLL) and a delay locked loop (DLL) for generating one or more clock signals such as clock signal 112. In another embodiment, the clock generator 110 is an intermediate level of a clock network or clock tree, and the clock generator 110 receives an external clock signal (not shown), which is used to generate the clock signal 112. In such an embodiment, the clock generator 110 includes the functionality of the delay adjuster 150.

In some embodiments, the delay adjuster 150 includes programmable repeaters such as inverters 152 and 154. Control unit 160 includes logic for enabling or disabling the inverters 152 and 154, and for determining drive strengths of the transistors of the inverters 152 and 154. In some embodiments, one or more of the clock generator 110 and the delay adjuster 150 receives clock enable signals (not shown) for disabling clock signals such as for an idle or sleep operating mode. Although flip-flops are shown in the signal paths 100, in other embodiments, one or more of the flip-flops 120 and 140 are replaced with another type of sequential storage element. Examples of other sequential storage elements are latch storage elements and a six-transistor (6T) random access memory (RAM) cell used as a storage element. Other implementations of a storage element for register 150 are possible and contemplated. In some embodiments, one or more of the flip-flops 120 and 140 capture and store data on a rising edge of received clock signals 112 and 158. In other embodiments, one or more of the flip-flops 120 and 140 capture and store data on a falling edge of received clock signals 112 and 158. Therefore, transistors are enabled by different voltage levels depending on the implementation.

As used herein, a signal is "asserted" when the signal has a voltage level that enables a transistor that receives the signal. The enabled transistor causes a transition in subsequent signals in a signal path. One example of a voltage level used to indicate a Boolean high level, which is also referred to as a "logic high level", is a voltage level within a transistor threshold voltage of the power supply voltage. A voltage level at the logic high level enables n-type metal oxide semiconductor (NMOS) field effect transistors (FETs), which are also referred to as "nfets". The voltage level at the logic high level also disables p-type metal oxide semiconductor (PMOS) FETs, which are also referred to as "pfets". When nfets receive the signal on gate terminals, the signal is considered "asserted" when the signal has a logic high level. When pfets receive the logic high level on gate terminals, the corresponding signal is considered to be "negated." In contrast, one example of a voltage level used to indicate a Boolean low level, which is also referred to as a "logic low level", is a voltage level within a transistor threshold voltage of the ground reference voltage. When pfets receive the logic low level on gate terminals, the corresponding signal is considered to be "asserted." When nfets receive the logic low level on gate terminals, the corresponding signal is considered to be "negated."

Clock uncertainties on the clock signals 112 and 158 include clock skew and clock jitter. Clock skew is the difference in time a clock signal takes to reach two different sequential elements. For example, the clock signal 112 reaches the flip-flop 120 at a different point in time than the clock signal 158 reaches the flip-flop 140. Clock jitter is the variation of a clock waveform edge from an expected predetermined threshold. Clock jitter affects the setup time, the hold time and the clock-to-output propagation delay of the flip-flops 120 and 140. To combat clock uncertainties, the signal monitor 180 receives one or more of the clock signals 112 and 158, and conveys the signal measurements 182 to one or more of the clock generator 110 and the delay adjuster 158. One or more of the clock generator 110 and the delay adjuster 158 perform adjustments of the clock signals 112 and 158 based on the received signal measurements 182.

In some embodiments, one or more of the clock signals 112 and 158 are a single-ended signal. In other embodiments, one or more of the clock signals 112 and 158 are a differential signal. In various embodiments, an interface of the signal monitor 180 is capable of receiving both single-ended signals and differential signals.

During operation, the control unit 170 sends a mode of operation 172 to the signal monitor 180. Examples of modes of operation include a duty cycle mode indicating a duty cycle of a selected signal is to be determined, and a skew mode indicating a skew between two selected signals is to be determined. In various embodiments, the signal monitor 180 uses pseudo-random sampling when determining duty cycle or skew. When determining the duty cycle of one or more of the clock signals 112 and 158, such as the clock signal 112, the signal monitor 180 generates a pseudo-random sampling signal. In an embodiment, the pseudo-random sampling signal includes multiple pseudo-random sampling periods. For example, the sampling signal includes multiple of periods of time having varying lengths.

For a duty cycle operation, in one embodiment, the signal monitor 180 uses a default reference voltage level such as a voltage level used to indicate a logic high level. In another embodiment, the signal monitor 180 selects a reference voltage level for indicating when the clock signal 112 is asserted. Therefore, the signal monitor 180 is capable of using a logic high level or a logic low level as the reference voltage level. When the signal monitor 180 determines one of the multiple pseudo-random sampling periods has elapsed, in an embodiment, the signal monitor 180 increments a first count of samples indicating a number of measured samples, and samples the clock signal 112 to generate a voltage level. Additionally, the signal monitor 180 increments a second count of samples indicating a number of samples in which the generated voltage level equals the reference voltage level. For example, when the signal monitor 180 determines that the generated voltage level equals the reference voltage level, the signal monitor 180 increments the second count. A ratio of the second count to the first count indicates a duty cycle of the clock signal 112. Using a similar approach relying on pseudo-random sampling, the signal monitor 180 is also capable of determining skew between two signals such as the clock signals 112 and 158.

Figure 2:
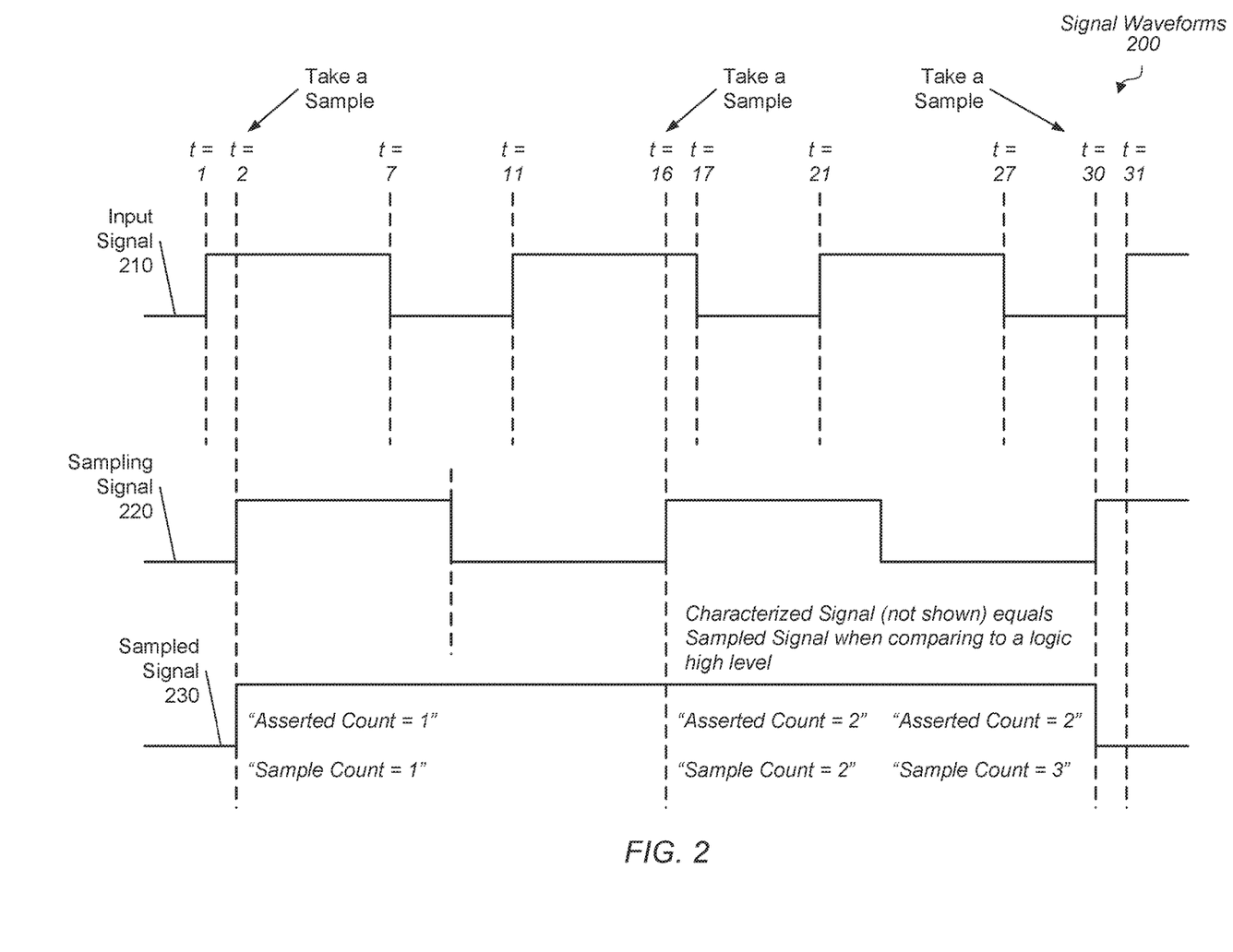
FIG. 2 is a block diagram of one embodiment of signal waveforms.

Turning now to FIG. 2, a generalized block diagram of one embodiment of signal waveforms 200 is shown. In the illustrated embodiment, multiple signals are shown with rising and falling edges marked at particular points in time. In an embodiment, an on-die signal monitor receives the input signal 210 and generates the pseudo-random sampling signal 220 to use when determining the duty cycle of the input signal 210. In various embodiments, the pseudo-random sampling signal 220 (or sampling signal 220) includes multiple pseudo-random sampling periods. Additionally, the signal monitor generates the sampled signal 230 based on both the input signal 210 and the sampling signal 220. As shown, the input signal 210 has a clock cycle period of 10 units (i.e., t=1 to t=11). The time units are arbitrary and any selected unit of time is possible and contemplated. As shown, the input signal 210 has a logic high level from time t=1 to time t=7, which is 6 units. Therefore, the duty cycle is 6 units/10 units, or 60%. The input signal 210 repeats with this period (e.g., rising edges occur at times t=1, t=11, t=21, t=31 and falling edges at times t=7, t=17, t=27 and so on).

In various embodiments, the sampling signal 220 has a different frequency and/or phase than the input signal 210. Further, the rising and falling edges of the sampling signal 220 are unaligned with the rising and falling edges of the input signal 210 a majority of the time. In some embodiments, the sampling signal 220 has multiple pseudo-random periods over the duration of the duty cycle operation. The multiple pseudo-random periods are not shown for ease of illustration. In one example, when the input signal 210 has a frequency of 10 gigahertz (GHz), the signal monitor generates the sampling signal with a frequency of 1.727 gigahertz for a first period of time, a frequency of 592 megahertz (MHz) for a second period of time, a frequency of 2.036 gigahertz for a third period of time, and so on. Each of the frequencies corresponds to a respective sampling period. In one embodiment, the signal monitor stores, in a programmable configuration register, a period of time for holding the sampling signal at a first sampling period before transitioning to a second sampling period. For example, the programmable configuration register stores the first period of time for holding the sampling signal at the frequency of 1.727 gigahertz (a first sampling period) before transitioning to the frequency of 592 megahertz (a second sampling period) for the sampling signal. In an embodiment, the signal monitor uses a delay before toggling the sampling signal 220. In some embodiments, the delay is also stored in a programmable configuration register. The signal monitor selects a default duty cycle for the sampling signal 220 such as 50%. In other embodiments, the signal monitor selects a varying duty cycle for the sampling signal 220 over time.

As used herein, a sampling signal, such as the sampling signal 220, may also be referred to as a pseudo-random sampling signal. In one embodiment, the signal monitor uses a pseudo-random generator to select a pseudo-random period for the sampling signal 220. In other embodiments, the signal monitor generates the sampling signal 220 based on the input signal 210. The signal monitor selects a ratio of the sampling period of the sampling signal 220 to the period of the input signal 210. In various embodiments, the ratio is a non-integer numerical value greater than one. In some embodiments, a programmable configuration register indicates a number of decimal places to be used for the ratio with the least significant decimal place storing a non-zero integer.

In the example shown, the selected sampling period is 14 units such as from time t=2 to time t=16. Therefore, the selected ratio is 14/10, or 1.4. In various embodiments, the input signal 210 has as relatively high frequency and the logic in the signal monitor is incapable of responding in time to process the input signal 210 for determining skew or duty cycle. Therefore, the logic of the signal monitor analyzes the sampled signal 230, which has a frequency lower than that of the input signal 210. The same results are found for the skew and duty cycle with the sampled signal 230 as compared with the input signal 210.

In one embodiment, the signal monitor samples the input signal 210 on the rising edge of the sampling signal 220 and the signal monitor selects the logic high level as the reference voltage level. At time t=1, the logic of the signal monitor samples the input signal 210 and determines that the input signal 210 has a logic high level. Therefore, the signal monitor generates the sampled signal 230 with a logic high level at time t=1. In addition, the signal monitor increments a first count, which is shown as the "Sample Count." This first count is incremented to 1. The signal monitor compares the voltage level of the sampled signal 230 to the selected reference voltage level, which is the logic high level. The signal monitor determines the two voltage levels are equal, and accordingly, increments a second count, which is shown as the "Asserted Count." This second count is incremented to 1.

At time t=16, the signal monitor again samples the input signal 210. Again, the logic of the signal monitor determines that the input signal 210 has a logic high level. Therefore, the signal monitor maintains the sampled signal 230 with a logic high level at time t=16. In addition, the signal monitor increments the first count ("Sample Count") from 1 to 2. The signal monitor compares the voltage level of the sampled signal 230 to the selected reference voltage level, which is the logic high level. The signal monitor determines the two voltage levels are equal, and accordingly, increments the second count ("Asserted Count") from 1 to 2.

The signal monitor samples again the input signal 210 at time t=30. Now, the logic of the signal monitor determines that the input signal 210 has a logic low level. Therefore, the signal monitor transitions the sampled signal 230 to a logic low level at time t=30. In addition, the signal monitor increments the first count ("Sample Count") from 2 to 3. The signal monitor compares the voltage level of the sampled signal 230 to the selected reference voltage level, which is the logic high level. The signal monitor determines the two voltage levels are unequal, and accordingly, maintains the second count ("Asserted Count") at 2. These steps continue for each sampling edge of the sampling signal 220. Logic within the signal monitor also generates a characterized signal, which indicates when the voltage levels of the sampled signal 230 is equal to the reference voltage level. Since the selected reference voltage level is the logic high level, the characterized signal is the same as the sampled signal 230 after a propagation delay of the logic in the signal monitor.

In an embodiment, the signal monitor stores in a programmable configuration register a limit of a number of samples to perform. One example is a limit of 10,000 samples. When the limit is reached, the signal monitor determines a ratio of the second count ("Asserted Count") to the first count ("Sample Count"). The ratio should be near or at 60%, which is the duty cycle of the input signal 210. The signal monitor conveys the result to one or more signal generators. When the duty cycle of the input signal 210 deviates from its designed value, the reporting by the signal monitor allows the corresponding one or more signal generators adjust the generation of clock signals in a clock network in order to realign the input signal 210 to its design requirement.

Figure 3:
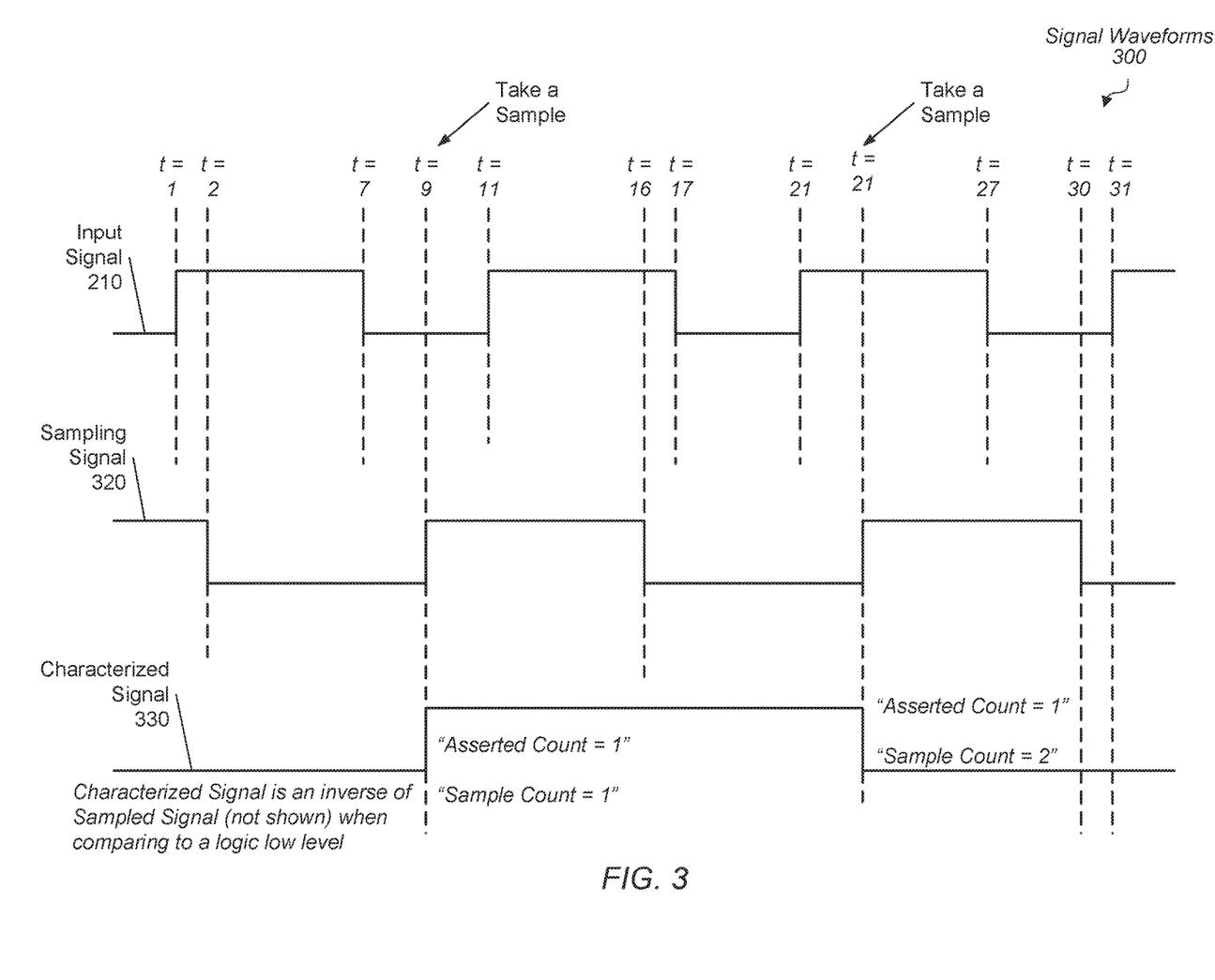
FIG. 3 is a block diagram of one embodiment of signal waveforms.

Referring to FIG. 3, a generalized block diagram of one embodiment of signal waveforms 300 is shown. Signals previously described are numbered identically. In an embodiment, an on-die signal monitor receives the input signal 210 and generates the pseudo-random sampling signal 320 (or sampling signal 320). In various embodiments, when generating the sampling signal 320, the signal monitor uses one of the techniques described earlier for generating the sampling signal 220 (of FIG. 2). The signal monitor also generates a sampled signal (not shown for ease of illustration) based on the input signal 210 and the sampling signal 320, and generates the characterized signal 330 based on whether the voltage level of a sampled version of the input signal 210 is equal to the selected reference voltage level. In this example, the signal monitor selects a logic low level as the reference logic level. It is noted that although the selected sampling signal 320 has the same period, duty cycle and ratio of 1.4 as the earlier sampling signal 220, the sampling signal 320 has a different delay in starting.

At time t=9, the logic of the signal monitor samples the input signal 210 and determines that the input signal 210 has a logic low level. Therefore, the signal monitor generates a sampled signal (not shown) with a logic low level. In addition, the signal monitor determines that the logic low level of the sampled signal is equal to the reference logic level (logic low level), and generates the characterized signal 330 with a rising edge at time t=9. Further, the signal monitor increments the first count ("Sample Count") from 0 to 1. Since the characterized signal 330 has a logic high level, the signal monitor increments the second count ("Asserted Count") from 0 to 1.

At time t=21, the logic of the signal monitor samples the input signal 210 and determines that the input signal 210 has a logic high level. Therefore, the signal monitor generates a sampled signal (not shown) with a logic high level. In addition, the signal monitor determines that the logic high level of the sampled signal does not equal the reference logic level (logic low level), and generates the characterized signal 330 with a falling edge at time t=21. Further, the signal monitor increments the first count ("Sample Count") from 1 to 2. Since the characterized signal 330 has a logic low level, the signal monitor maintains the second count ("Asserted Count") at 1.

When the limit of the number of samples is reached, the signal monitor determines a ratio of the second count ("Asserted Count") to the first count ("Sample Count"). The ratio should be near or at 40%, which is the duty cycle of the input signal 210 when the logic low level is used for enabling circuitry. For example, the input signal 210 has a logic low level between the time t=7 and t=11. The signal monitor conveys the result to one or more signal generators.

Figure 4:
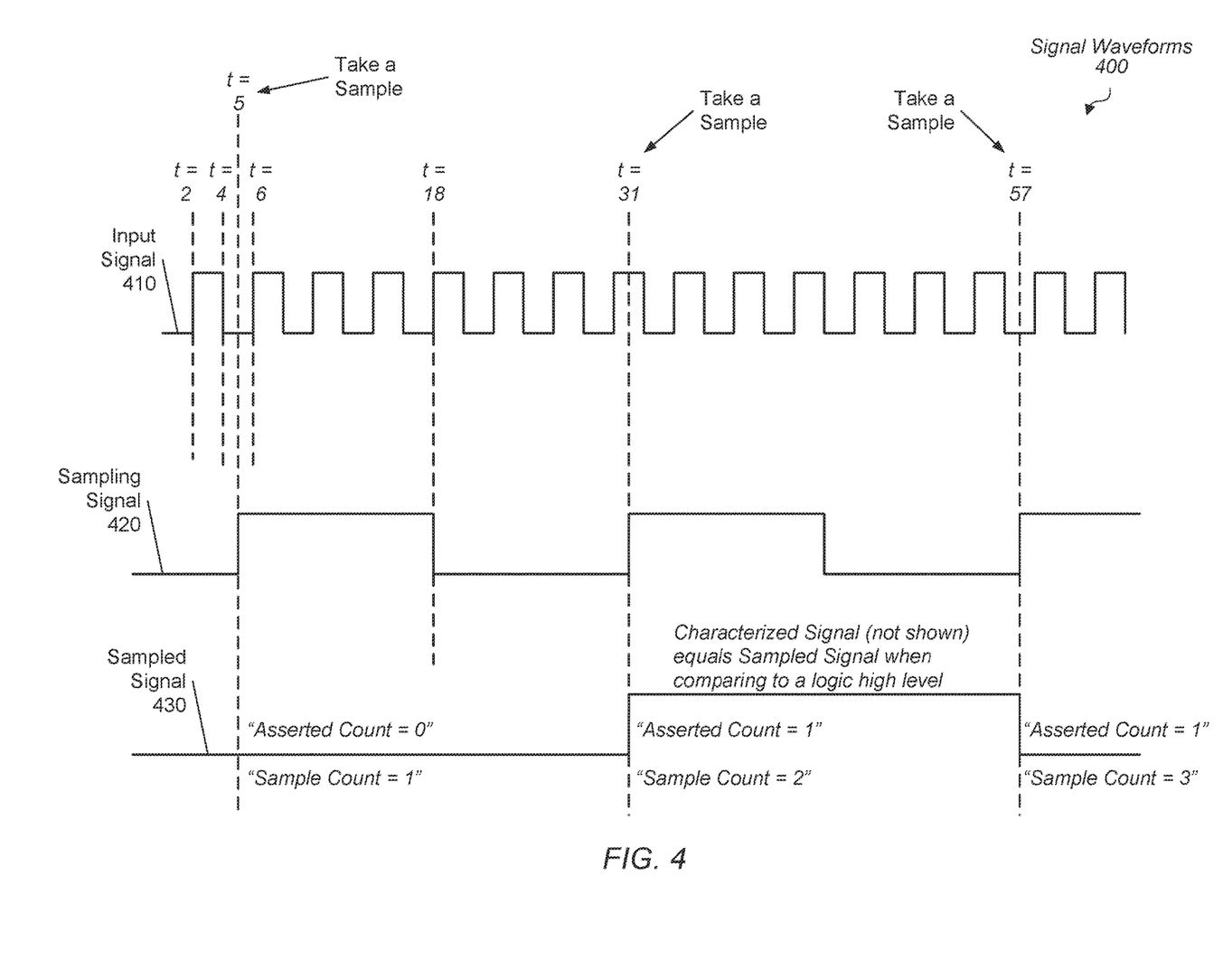
FIG. 4 is a block diagram of one embodiment of signal waveforms.

Turning now to FIG. 4, a generalized block diagram of one embodiment of signal waveforms 400 is shown. The difference in the periods of an input signal and a sampling signal are further highlighted in the illustrated embodiment when compared to the example for the signal waveforms 200. The input signal 410 has a period of 4 units such as from time t=2 to time t=6. In the example, the selected sampling period of the sampling signal 420 is 26 units such as from time t=5 to time t=31. Therefore, the ratio of the sampling period of the sampling signal 420 to the period of the input signal 410 is 31/4, or 7.75. Typically, the ratio is far greater and multiple ratios for multiple periods of time are used, but for ease of illustration, the single ratio is shown.

In one embodiment, the signal monitor samples the input signal 410 on the rising edge of the sampling signal 420 and the signal monitor selects the logic high level as the reference voltage level. At time t=5, the signal monitor samples the input signal 410. The logic of the signal monitor determines that the input signal 410 has a logic low level. Therefore, the signal monitor maintains the sampled signal 430 with a logic high level at time t=5. In addition, the signal monitor increments the first count ("Sample Count") from 0 to 1. The signal monitor compares the voltage level of the sampled signal 430 to the selected reference voltage level (logic high level) and determines the two voltage levels are unequal. Accordingly, the signal monitor maintains the second count ("Asserted Count") at 0.

At time t=31, the signal monitor samples the input signal 410. The logic of the signal monitor determines that the input signal 410 has a logic high level. Therefore, the signal monitor transitions the sampled signal 430 to a logic high level at time t=31. In addition, the signal monitor increments the first count ("Sample Count") from 1 to 2. The signal monitor compares the voltage level of the sampled signal 430 to the selected reference voltage level (logic high level) and determines the two voltage levels are equal. Accordingly, the signal monitor increments the second count ("Asserted Count") from 0 to 1.

At time t=57, the signal monitor samples the input signal 410. The logic of the signal monitor determines that the input signal 410 has a logic low level. Therefore, the signal monitor transitions the sampled signal 430 to a logic low level at time t=57. In addition, the signal monitor increments the first count ("Sample Count") from 2 to 3. The signal monitor compares the voltage level of the sampled signal 430 to the selected reference voltage level (logic high level) and determines the two voltage levels are unequal. Accordingly, the signal monitor maintains the second count ("Asserted Count") at 1.

When the limit of the number of samples is reached, the signal monitor determines a ratio of the second count ("Asserted Count") to the first count ("Sample Count"). The ratio should be near or at 50%, which is the duty cycle of the input signal 410. For example, the input signal 210 has a logic high level between the time t=2 and t=4, and the input signal has a logic low level between the time t=4 and t=6. The signal monitor conveys the result to one or more signal generators.

Figure 5:
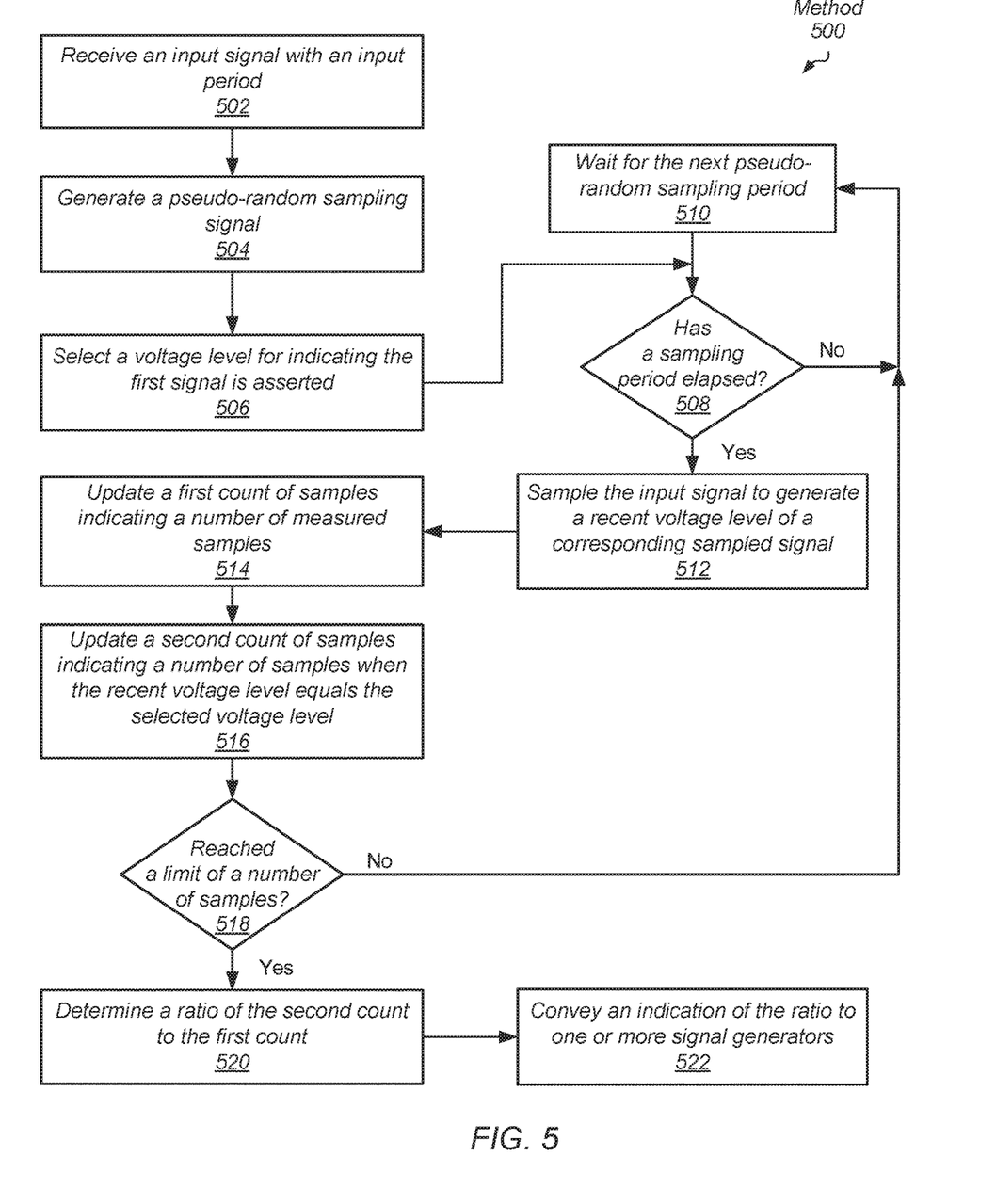
FIG. 5 is a flow diagram of one embodiment of a method for efficiently characterizing signals.

Referring now to FIG. 5, a generalized flow diagram of one embodiment of a method 500 for efficiently characterizing signals is shown. For purposes of discussion, the steps in this embodiment (as well as for FIG. 9) are shown in sequential order. However, in other embodiments some steps may occur in a different order than shown, some steps may be performed concurrently, some steps may be combined with other steps, and some steps may be absent.

In various embodiments, an electronic circuit includes a post-silicon and on-die signal monitor and a signal generator. The signal generator generates a signal with a signal period and sends it to the signal monitor. In various embodiments, the signal generator is a clock signal generator, the signal is a clock signal, and the signal period is a clock cycle period. The signal monitor receives the signal as an input signal with an input period equal to the signal period (block 502). In an embodiment, an on-die control unit sends a mode of operation to the signal monitor. In other embodiments, the signal monitor includes the logic of the control unit. Examples of the modes of operation are a duty cycle mode for determining a duty cycle of a selected signal and a skew mode for determining a skew between two selected signals. In various embodiments, the signal monitor uses pseudo-random sampling when determining duty cycle or skew. For a single signal, the signal monitor determines a duty cycle.

The signal monitor generates a pseudo-random sampling signal to use when determining the duty cycle of the input signal (block 504). In an embodiment, the pseudo-random sampling signal (or sampling signal) includes multiple pseudo-random sampling periods. In various embodiments, when generating the sampling signal, the signal monitor uses one of the techniques described earlier for generating the sampling signal 220 (of FIG. 2). In an embodiment, the signal monitor also selects a reference voltage level for indicating when the input signal is asserted (block 506). In another embodiment, the signal monitor uses a default reference voltage level. In one embodiment, the reference voltage level is a Boolean logic high level. If the signal monitor determines that none of the multiple pseudo-random sampling periods have elapsed ("no" branch of the conditional block 508), then the signal monitor waits for the next sampling period (block 510). If the signal monitor determines that one of the multiple pseudo-random sampling periods has elapsed ("yes" branch of the conditional block 508), then the signal monitor samples the input signal to generate a recent voltage level of a corresponding sampled signal (block 512). The varying voltage levels of the sampled signal 230 (of FIG. 2) are examples of the generated voltage levels during sampling.

Due to determining that one of the multiple pseudo-random sampling periods has elapsed, the signal monitor updates a first count of samples indicating a number of measured samples (block 514). In an embodiment, the signal monitor increments the first count by one. The signal monitor also updates a second count of samples indicating a number of samples when the signal monitor determines that the recent voltage level equals the selected voltage level (block 516). In an embodiment, the signal monitor increments the second count by one when the signal monitor determines the recent voltage level equals the selected voltage level. In some embodiments, the signal monitor uses a limit of a number of samples to determine when to convey measurement data for the input signal. For example, a limit of 10,000 samples can be used. In some embodiments, the limit is stored in a programmable configuration register.

If the signal monitor determines the limit of the number of samples has not been reached ("no" branch of the conditional block 518), then control flow of method 500 returns to block 510 where the signal monitor waits for the next sampling period. However, if the signal monitor determines the limit of the number of samples has been reached ("yes" branch of the conditional block 518), then the signal monitor determines a ratio of the second count to the first count (block 520). Afterward, the signal monitor conveys an indication of the ratio to one or more signal generators (block 522).

Figure 6:
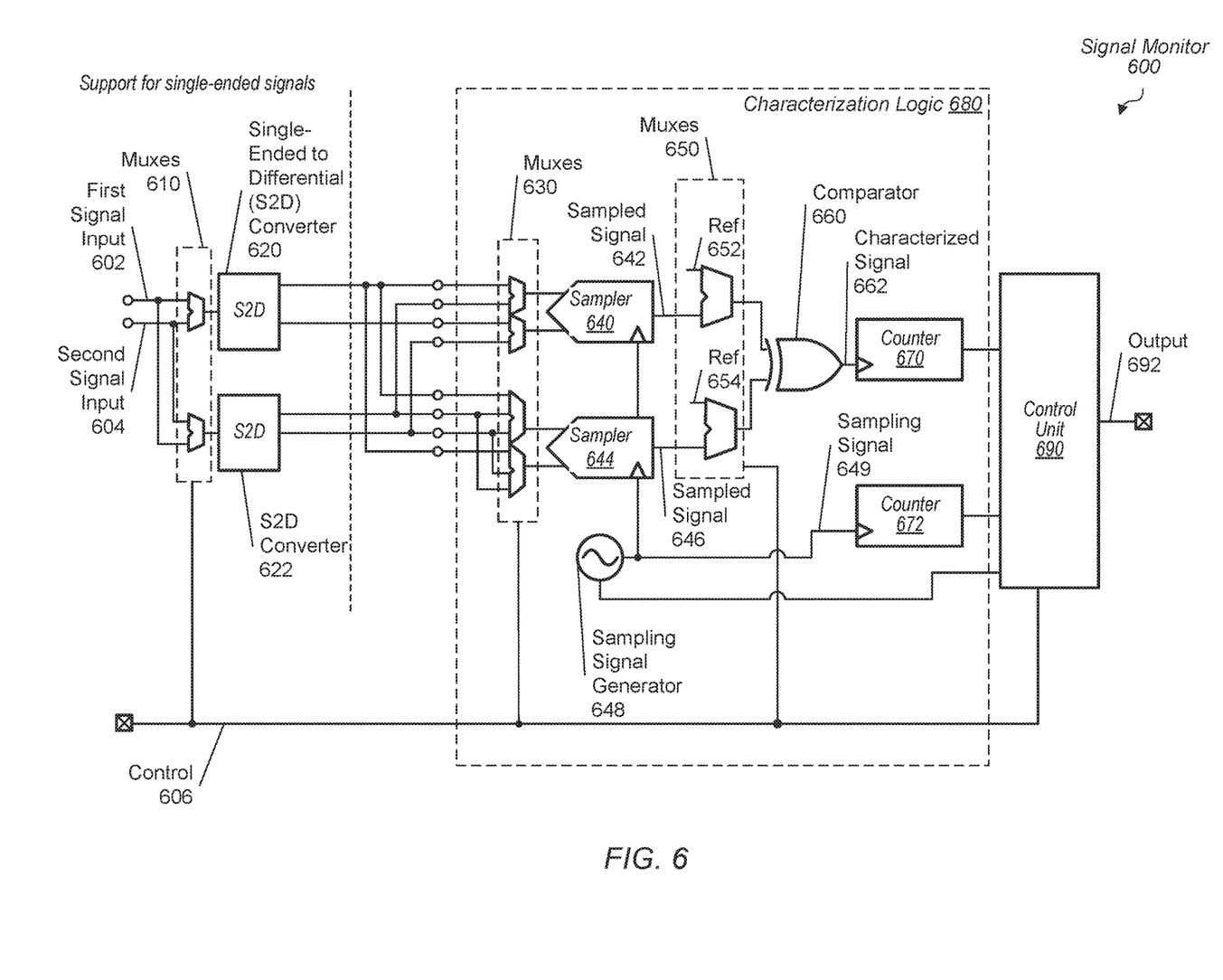
FIG. 6 is a block diagram of one embodiment of a signal monitor for characterizing signals.

Referring to FIG. 6, a generalized block diagram of one embodiment of a signal monitor 600 is shown. In various embodiments, signal monitor 600 is an on-die signal monitor, which includes characterization logic 680 and a control unit 690, for characterizing one or more signals generated on a semiconductor die post-silicon and in a manufactured product. Therefore, signal monitor 600 is not merely on a semiconductor die for testing. In various embodiments, the signal monitor 600 determines duty cycle and skew for signals using pseudo-random sampling. In some embodiments, signal monitor 600 receives one or more differential signals. In other embodiments, signal monitor 600 receives one or more single-ended signals. For example, in an embodiment, signal monitor 600 is capable of receiving a first signal on the first signal input 602 (or input 602) and a second signal on the second signal input 604 (or input 604), and generating measurement data as output 692.

In some embodiments, an external signal generator generates the first signal received on the input 602 with a first period and sends it to the signal monitor 600. In various embodiments, the first signal on input 602 is a clock signal and the first period is a clock cycle period. Similarly, an external signal generator generates the second signal with a second period and sends it to the signal monitor 600. In various embodiments, the second signal received on input 604 is also a clock signal and the second period is a clock cycle period. In an embodiment, signal monitor 600 includes single-ended-to-differential converters 620 and 622 (or converters 620 and 622) for converting single-ended signals to differential inputs. In other embodiments, one or more of the first signal on input 602 and the second signal on input 604 are driven by external signal generators as differential output signals, and don't need converting in signal monitor 600.

In some embodiments, signal monitor 600 includes the multiplexers (or muxes) 610 for selecting which one of the converters 620 and 622 receives which one of the first signal 602 and the second signal 604. Therefore, the illustrated embodiment of the signal monitor 600 is configurable and other embodiments of the signal monitor 600 includes more or less of the number of components and the flexibility offered by the components such as regarding the types of received signals and which input receives which type of signals. For example, when the signal monitor 600 receives an indication of a skew mode of operation, the signal monitor 600 receives two separate signals on the inputs 602 and 604.

When the signal monitor 600 receives an indication of a delay or duty cycle mode of operation, the signal monitor 600 receives a signal on one of the two inputs 602 and 604, and control unit 690 determines a reference voltage level to convey as Ref 652 and/or Ref 654 in muxes 650. The control unit 690 also selects the reference voltage level to convey on Ref 652 and/or Ref 654 for indicating when the first signal is asserted based on control information received on control input 606. In an embodiment, the control information on the control input 606 indicates a duty cycle mode of operation and indicates that a signal received on input 602 uses a logic high level to indicate an asserted signal. In response, the control unit 690 conveys a logic low level, such as the ground reference level, to the characterization logic 680 as Ref 652 or Ref 654, since later stages of logic uses a Boolean exclusive-OR (XOR) gate as the comparator 660. In other embodiments, other values and other Boolean logic gates are used in the characterization logic 680 of signal monitor 600.

The select lines of the muxes 610, 630 and 650 receive control inputs from either an external control unit via the control input 606 or the local control unit 690. The implementation of the selection logic, such as the muxes 610, 630 and 650, includes pass-gate muxes, Boolean logic gates, or otherwise based on design choice. The samplers 640 and 644 sample the outputs of the converters 620 and 622 when these converters are used. Selection logic, such as the muxes 630, route signals to the samplers 640 and 644. In some embodiments, one or more of the samplers 640 and 644 are implemented as one-bit analog-to-digital converters (ADCs). The sampler 640 generates the sampled signal 642, and the sampler 644 generates the sampled signal 646. The sampled signal 430 (of FIG. 4) provides an example of these sampled signals 642 and 644. The samplers 640 and 644 use a sampling signal 649 generated by the sampling signal generator 648. In various embodiments, during calibration of the samplers 640 and 644, the control information 606 adjusts the selection performed by the muxes 630 to switch which input of the samplers 640 and 644 receives which signal. Therefore, any detected offset of one or more of the samplers 640 and 644 can be removed following calibration.

In an embodiment, one or more of the sampling signal generator 648 and the control unit 690 determine the pseudo-random period of the sampling signal 649 based on control information received on the control input 606. In various embodiments, when generating the sampling signal 649, one or more of the sampling signal generator 648 and the control unit 690 uses one of the techniques described earlier for generating the sampling signal 220 (of FIG. 2). In an embodiment, the control unit 690 determines the values on the select lines for the muxes 650 based on at least the mode of operation received on control input 606. In some embodiments, the comparator 660 receives one or more of voltage levels of sampled signals and reference voltage levels for comparing. In one embodiment, the comparator 660 is implemented by a Boolean exclusive-OR (XOR) gate. However, a variety of other Boolean logic gates can be used to implement the comparator 660. When performing a duty cycle mode of operation, the comparator 660 generates an indication specifying whether a voltage level of a selected one of the sampled signals 642 and 646 equals a selected one of the voltage reference levels (Ref 652 and Ref 654). The output of the comparator 660 is the characterized signal 662. An example of the characterization signal is the characterized signal 330 (of FIG. 3).

The sampled signals 642 and 644 and the characterized signal 662 have larger signal periods than the clock cycle periods of signals received on inputs 602 and 604. Therefore, despite having a relative slow response time, the comparator 660 is able to determine the duty cycle of a signal received on one of the inputs 602 and 604. Similarly, despite having a relative slow response time, the comparator 660 is able to determine the skew between two signals received on the inputs 602 and 604. In some embodiments, the control unit 690 includes the counters 670 and 672. In other embodiments, the characterization logic 680 includes the counters 670 and 672.

In an embodiment, each time a sampling period has elapsed, the counter 672 updates a first count. In some embodiments, the counter 672 increments the first count by one. The counter 670 updates a second count, such as incrementing by one, but performs the update based on whether the two received voltage levels are unequal when the mode of operation is a skew mode. When the mode of operation is a duty cycle mode, the counter 670 performs the update based on whether the two received voltage levels are equal. However, as described in an earlier example, the reference voltage level can be a logic high level, but the voltage level conveyed from the control unit 690 to one of the reference voltage levels Ref 652 and Ref 654 is a logic low level based on the comparator 660 being implemented with a Boolean XOR gate. Therefore, when the characterized signal 662 has a logic high level, it indicates that the two received voltage levels from the muxes 650 are unequal, but the sampled voltage level equals the logic high level selected by the control unit 690.

In an embodiment, the control unit 690 uses a limit of a number of samples to determine when to convey measurement data. For example, a limit of 10,000 samples can be used although another limit is used in other embodiments. In some embodiments, the limit is stored in a programmable configuration register. When the control unit 690 determines that the limit is reached, in some embodiments, the control unit 690 determines a ratio of the second count to the first count. In some embodiments, the control unit 690 performs a lookup into a table storing mappings of ratios to codes. In some embodiments, the control unit 690 multiplies the ratio by a factor the lookup and/or before sending the indication of the ratio to one or more signal generators on output 692. For example, in an embodiment, the control unit 690 multiples the ratio by one half to provide an indication of a single edge (rising or falling) skew. In another embodiment, the signal monitor conveys on output 692 the factor as a separate value from the ratio to one or more signal generators.

In some embodiments, the control unit 690 detects which of the two signals received on inputs 602 and 604 has a logic high level on the sampled signals 642 and 646 when generating the characterized signal 662. Therefore, the control unit 690 determines which of the two signals is ahead of the other. In such embodiments, the control unit 690 sends, along with the indication of the ratio, an indication of which of the first signal and the second signal is leading the other. A variety of other steps for measuring and processing data corresponding to signals received on inputs 602 and 604 are possible and contemplated. It is also noted that the functionality of one or more of the characterization logic 680 and the control unit 690 is implemented by hardware, software, or both.

Figure 7:
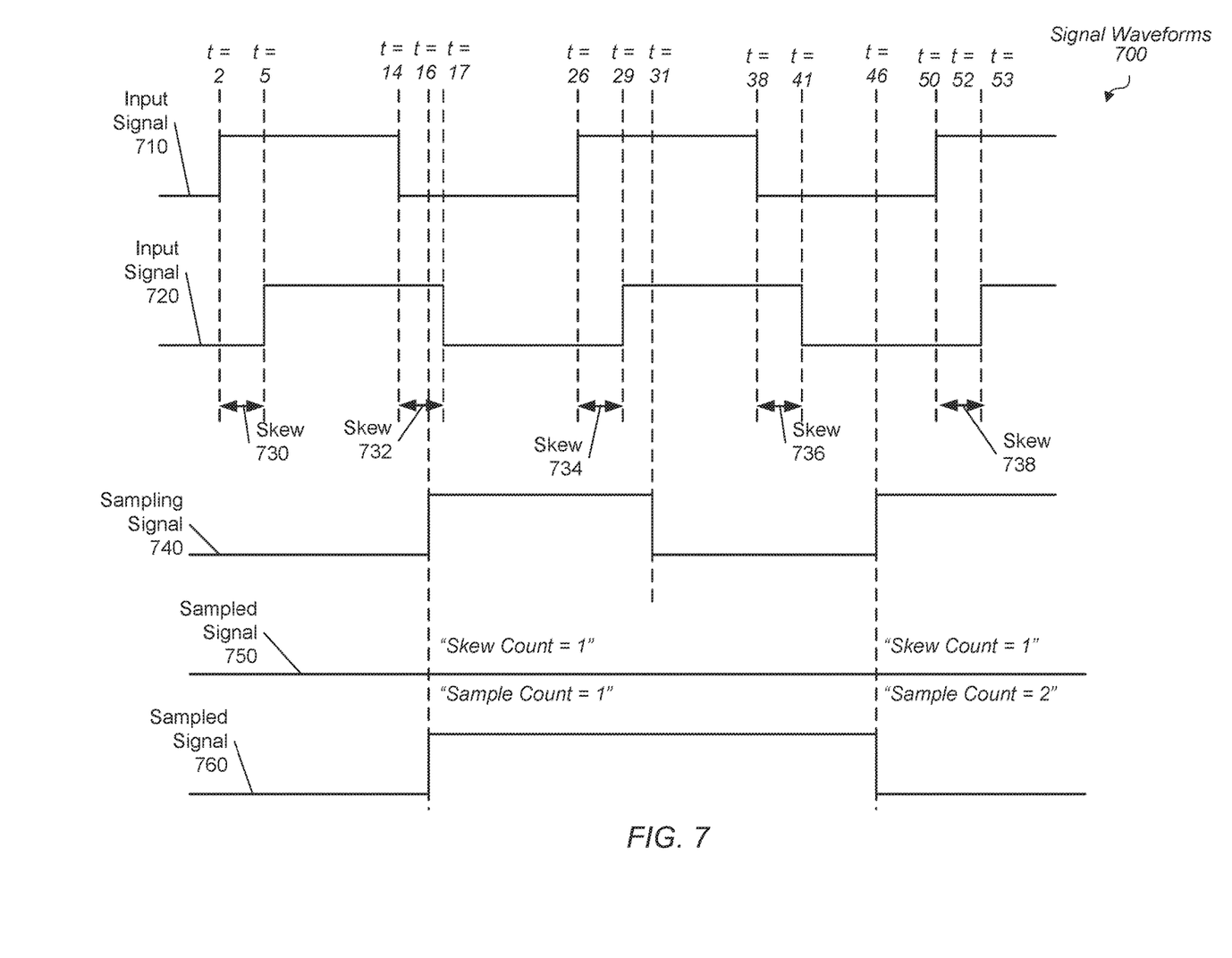
FIG. 7 is a block diagram of one embodiment of signal waveforms.

Turning now to FIG. 7, a generalized block diagram of one embodiment of signal waveforms 700 is shown. In an embodiment, an on-die signal monitor receives the input signals 710 and 720, generates the sampling signal 740 and generates the sampled signals 750 and 760 based on the input signals 710 and 720 and the sampling signal 740. In various embodiments, when generating the sampling signal 740, the signal monitor uses one of the techniques described earlier for generating the sampling signal 220 (of FIG. 2). As shown, the input signal 710 has a clock cycle period (or period) of 24 units such as from time t=2 to time t=26. The input signal 720 has a period of 24 units such as from time t=5 to time t=29. Each of the input signals 710 and 720 have a duty cycle of 50%. However, the input signals 710 and 720 are unaligned. For example, the input signal 710 has a rising edge at time t=2, whereas, the input signal 720 has a rising edge at time t=5. Therefore, the skew 730 is 3 time units. Similarly, the falling edge skew is 3 time units. For example, the input signal 710 has a falling edge at time t=14, whereas, the input signal 720 has a falling edge at time t=17. Therefore, the skew 732 is 3 time units. Each of the skews 734, 736 and 738 has a duration of 3 time units.

In various embodiments, the signal monitor generates one or more pseudo-random sampling periods over time for the sampling signal 740. In the example, the generated sampling period is 30 units such as from time t=16 to time t=46. Therefore, the ratio of the sampling period to the periods of the input signals 710 and 720 is 30/24, or 1.25. As described earlier, typically, the ratio is far greater, but for ease of illustration, the ratio is shown as a value near one. As described earlier, in some embodiments, the signal monitor "randomizes" the pseudo-random sampling period when compared to the input signal periods for the input signals 710 and 720.

In one embodiment, the signal monitor samples the input signal 210 on the rising edge of the sampling signal 740. The signal monitor does not select a reference voltage level when measuring skew, since the input signals 710 and 720 are reference signals with respect to one another. At time t=16, the signal monitor samples the input signals 710 and 720. The logic of the signal monitor determines that the input signal 710 has a logic low level. Therefore, the signal monitor maintains the sampled signal 750 with a logic low level at time t=16. The logic of the signal monitor determines that the input signal 720 has a logic high level. Therefore, the signal monitor transitions the sampled signal 760 to a logic high level at time t=16. In addition, the signal monitor increments the first count ("Sample Count") from 0 to 1. The signal monitor compares the voltage levels of the sampled signals 750 and 760, and determines that they are unequal. Accordingly, the signal monitor increments the second count ("Skew Count") from 0 to 1.

At time t=46, the signal monitor samples the input signals 710 and 720. The logic of the signal monitor determines that each of the input signals 710 and 720 has a logic low level. Therefore, the signal monitor maintains the sampled signal 750 with a logic low level at time t=46, but transitions the sampled signal 760 to a logic low level. In addition, the signal monitor increments the first count ("Sample Count") from 1 to 2. The signal monitor compares the voltage levels of the sampled signals 750 and 760, and determines that they are equal. Accordingly, the signal monitor maintains the second count ("Skew Count") at 1. When the limit of the number of samples is reached, the signal monitor determines a ratio of the second count ("Skew Count") to the first count ("Sample Count"). The ratio indicates the sum of the rising edge skew and the falling edge skew between the input signals 710 and 720. The signal monitor conveys the result to one or more signal generators.

Figure 8:
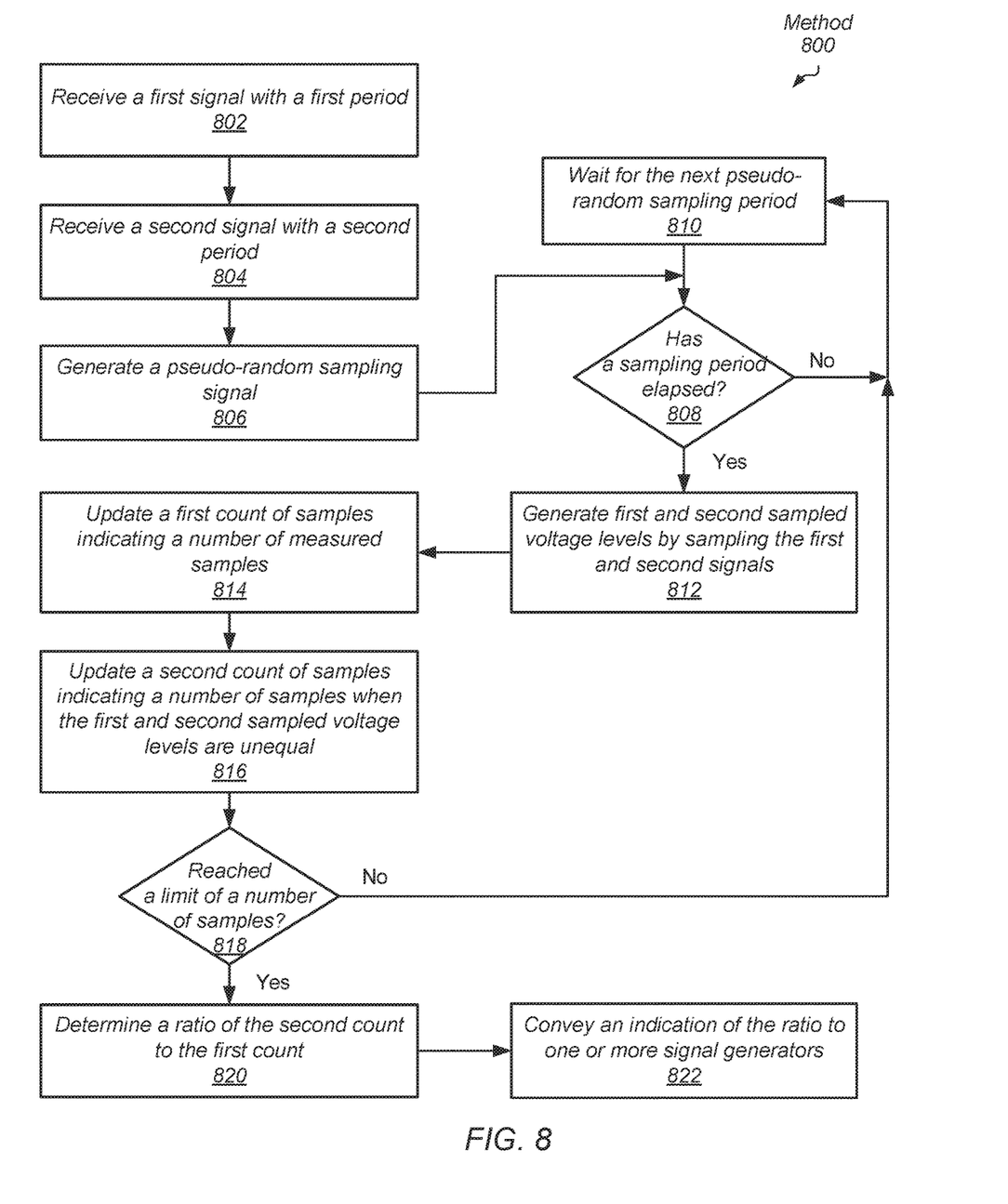
FIG. 8 is a flow diagram of one embodiment of a method for efficiently characterizing signals.

Referring now to FIG. 8, a generalized flow diagram of one embodiment of a method 800 for efficiently characterizing signals is shown. In various embodiments, an electronic circuit includes a post-silicon and on-die signal monitor, a first signal generator, and a second signal generator. The first signal generator generates a first signal with a first period and sends it to the signal monitor. In various embodiments, the first signal is a clock signal and the first period is a clock cycle period. Similarly, the second signal generator generates a second signal with a second period and sends it to the signal monitor. In various embodiments, the second signal is a clock signal and the second period is a clock cycle period. The signal monitor receives the first signal with the first period (block 802). The signal monitor receives the second signal with the second period (block 804).

In an embodiment, an on-die control unit sends a mode of operation to the signal monitor. In other embodiments, the signal monitor includes the logic of the control unit. Examples of the modes of operation are a duty cycle mode for determining a duty cycle of a selected signal and a skew mode for determining a skew between two selected signals. In various embodiments, the signal monitor uses pseudo-random sampling when determining duty cycle or skew. For two signals, the signal monitor determines a skew. The signal monitor generates a pseudo-random sampling signal to use when determining the skew (block 806). In an embodiment, the pseudo-random sampling signal (or sampling signal) includes multiple pseudo-random sampling periods. In various embodiments, when generating the sampling signal, the signal monitor uses one of the techniques described earlier for generating the sampling signal 220 (of FIG. 2).

If the signal monitor determines that none of the multiple pseudo-random sampling periods have elapsed ("no" branch of the conditional block 808), then the signal monitor waits for the next sampling period (block 810). If the signal monitor determines that one of the multiple pseudo-random sampling periods has elapsed ("yes" branch of the conditional block 808), then the signal monitor samples the first signal and the second signal to generate a first voltage level and a second voltage level of corresponding sampled signals (block 812). The varying voltage levels of the sampled signals 750 and 760 (of FIG. 7) are examples of the generated voltage levels during sampling.

The signal monitor updates a first count of samples indicating a number of measured samples (block 814). In an embodiment, the signal monitor increments the first count by one. The signal monitor also updates a second count of samples indicating a number of samples when the first voltage level does not equal the second voltage level (block 816). In an embodiment, the signal monitor increments the second count by one when the signal monitor determines the first voltage level does not equal the second voltage level. In some embodiments, the signal monitor uses a limit of a number of samples to determine when to convey measurement data for the input signal. For example, a limit of 10,000 samples can be used. In some embodiments, the limit is stored in a programmable configuration register.

If the signal monitor determines the limit of the number of samples has not been reached ("no" branch of the conditional block 818), then control flow of method 800 returns to block 810 where the signal monitor waits for the next sampling period. However, if the signal monitor determines the limit of the number of samples has been reached ("yes" branch of the conditional block 818), then the signal monitor determines a ratio of the second count to the first count (block 820). Afterward, the signal monitor conveys an indication of the ratio to one or more signal generators (block 822).

In an embodiment, the indication is a code determined by a lookup into a table storing mappings of the ratios to codes. In some embodiments, the signal monitor multiplies the ratio by a factor before sending the indication of the ratio to one or more signal generators. For example, in an embodiment, the signal monitor multiples the ratio by one half to provide an indication of a single edge (rising or falling) skew. In another embodiment, the signal monitor conveys the factor as a separate value from the ratio to one or more signal generators. In yet another embodiment, a signal generator multiplies a value corresponding to the received indication of the ratio by its own factor.

In some embodiments, the signal monitor detects which of the first voltage level and the second voltage level has a logic high level when generating the characterized signal. Therefore, the signal monitor determines which of the first signal and the second signal is ahead of the other. In such embodiments, the signal monitor sends, along with the indication of the ratio, an indication of which of the first signal and the second signal is leading the other. A variety of other steps for measuring and processing data corresponding to the first signal and the second signal are possible and contemplated.

In various embodiments, program instructions of a software application may be used to implement the methods and/or mechanisms previously described. The program instructions describe the behavior of hardware in a high-level programming language, such as C. Alternatively, a hardware design language (HDL) is used, such as Verilog. The program instructions are stored on a non-transitory computer readable storage medium. Numerous types of storage media are available. The storage medium is accessible by a computer during use to provide the program instructions and accompanying data to the computer for program execution. In some embodiments, a synthesis tool reads the program instructions in order to produce a netlist including a list of gates from a synthesis library.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. An apparatus comprising:
   a first input configured to receive a first signal with a first signal period;
   a second input configured to receive a second signal with a second signal period; and
   characterization logic; and
   a control unit; and
   wherein in response to determining a first period of time of a first plurality of periods of time having varying lengths has elapsed:
     the characterization logic is configured to:
       sample the first signal to determine a first voltage level;
       sample the second signal to determine a second voltage level; and
       generate a first characterized signal based on a comparison of the first voltage level to the second voltage level; and
     the control unit is configured to determine a skew between the first signal and the second signal, based on a duty cycle of the first characterized signal.

2. The apparatus as recited in claim 1, wherein the control unit is further configured to, in response to determining the first period of time has elapsed:
   increment a first count of samples indicating a number of measured samples;
   increment a second count of samples, responsive to receiving an indication from the characterization logic specifying that the first voltage level does not equal the second voltage level; and
   determine the skew by determining a ratio of the second count to the first count.

3. The apparatus as recited in claim 1, wherein the characterization logic is further configured to convert one or more of the first signal and the second signal from a single-ended signal to a differential signal prior to sampling.

4. The apparatus as recited in claim 1, wherein the control unit is configured to, in response to detecting a mode of operation in which a duty cycle is to be determined:
   generate a sampling signal with a second plurality of periods of time having varying lengths.

5. The apparatus as recited in claim 4, wherein in response to determining a second period of time of the second plurality of periods of time has elapsed:
the characterization logic is further configured to:
sample a third signal to determine a third voltage level; and
compare the third voltage level to a reference voltage level to determine a second characterized signal; and
the control unit is further configured to determine a duty cycle of the second characterized signal.

6. The apparatus as recited in claim 5, wherein, the control unit is further configured to, in response to the second period of time having elapsed:
increment a third count of samples indicating a number of measured samples;
increment a fourth count of samples, responsive to receiving an indication from the characterization logic specifying that the third voltage level equals the reference voltage level; and
determine the duty cycle of the second characterized signal by determining a ratio of the fourth count to the third count.

7. The apparatus as recited in claim 1, wherein the characterization logic is further configured to generate one or more of the first plurality of periods of time to have a first ratio to the first signal period and a second ratio to the second signal period, such that each of the first ratio and the second ratio:
is greater than one; and
is a non-integer numerical value.

8. The apparatus as recited in claim 1, wherein the control unit is further configured to store, in a programmable configuration register, a delay used for delaying toggling of a sampling signal with the first plurality of periods of time.

9. A method, comprising:
sending, by a first signal generator, a first signal with a first signal period to a signal monitor;
sending, by a second signal generator, a second signal with a second signal period to the signal monitor;
in response to determining, by the signal monitor, a first period of time of a first plurality of periods of time having varying lengths has elapsed:
sampling, by the signal monitor, the first signal to determine a first voltage level;
sampling, by the signal monitor, the second signal to determine a second voltage level; and
generating, by the signal monitor, a first characterized signal based on a comparison of the first voltage level to the second voltage level; and
determining, by the signal monitor, a skew between the first signal and the second signal based on a duty cycle of the first characterized signal.

10. The method as recited in claim 9, further comprising:
in response to determining the first period of time has elapsed:
incrementing, by the signal monitor, a first count of samples indicating a number of measured samples;
incrementing, by the signal monitor, a second count of samples, responsive to determining that the first voltage level does not equal the second voltage level; and
determining, by the signal monitor, the skew by determining a ratio of the second count of samples to the first count of samples.

11. The method as recited in claim 9, further comprising converting one or more of the first signal and the second signal from a single-ended signal to a differential signal prior to sampling.

12. The method as recited in claim 9, further comprising:
in response to receiving, by the signal monitor, a mode of operation indicating a duty cycle is to be determined:
generating a sampling signal with a second plurality of periods of time having varying lengths.

13. The method as recited in claim 12, further comprising:
in response to determining a second period of time of the second plurality of periods of time has elapsed:
sampling, by the signal monitor, a third signal to determine a third voltage level;
comparing, by the signal monitor, the third voltage level to a reference voltage level to determine a second characterized signal; and
determining, by the signal monitor, a duty cycle of the second characterized signal.

14. The method as recited in claim 13, wherein in further response to one of the second plurality of pseudo-random sampling periods has elapsed, the method further comprises:
incrementing, by the signal monitor, a third count of samples indicating a number of measured samples;
incrementing, by the signal monitor, a fourth count of samples, responsive to determining that the third voltage level equals the reference voltage level; and
determining, by the signal monitor, the duty cycle of the second characterized signal by determining a ratio of the fourth count to the third count.

15. The method as recited in claim 9, further comprising storing, in a programmable configuration register by the signal monitor, a delay used for delaying toggling of a sampling signal with the first plurality of periods of time.

16. A processor comprising:
a signal monitor;
a first signal generator configured to send a first signal with a first signal period to the signal monitor; and
a second signal generator configured to send a second signal with a second signal period to the signal monitor;
wherein the signal monitor is configured to,
in response to determining a first period of time of a first plurality of periods of time having varying lengths has elapsed:
sample the first signal to determine a first voltage level;
sample the second signal to determine a second voltage level;
generate a first characterized signal based on a comparison of the first voltage level to the second voltage level; and
determine a skew between the first signal and the second signal based on a duty cycle of the first characterized signal.

17. The processor as recited in claim 16, wherein the signal monitor is further configured to,
in response to determining the first period of time has elapsed:
increment a first count of samples indicating a number of measured samples;
increment a second count of samples, responsive to determining that the first voltage level does not equal the second voltage level; and
determine the skew by determining a ratio of the second count of samples to the first count of samples.

18. The processor as recited in claim 16, wherein the signal monitor is further configured to convert one or more of the first signal and the second signal from a single-ended signal to a differential signal prior to sampling.

19. The processor as recited in claim 16, wherein the signal monitor is configured to,
    in response to receiving a mode of operation indicating a duty cycle is to be determined:
        generate a sampling signal with a second plurality of periods of time having varying lengths.

20. The processor as recited in claim 19, wherein the signal monitor is configured to,
    in response to determining a second period of time of the second plurality of periods of time has elapsed:
        sample a third signal to determine a third voltage level;
        compare the third voltage level to a reference voltage level to determine a second characterized signal; and
        determine a second duty cycle of the second characterized signal.

\* \* \* \* \*